United States Patent
Huang et al.

(10) Patent No.: US 7,019,582 B2
(45) Date of Patent: Mar. 28, 2006

(54) SILICON-ON-INSULATOR DEVICE STRUCTURE

(75) Inventors: Chiu-Tsung Huang, Hsinchu (TW); Ke-Kung Liao, Yunlin (TW); Jen-Chi Chung, Hsinchu (TW); Li-Lun Chi, Taipei (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/711,624

(22) Filed: Sep. 29, 2004

(65) Prior Publication Data

US 2005/0029590 A1     Feb. 10, 2005

Related U.S. Application Data

(62) Division of application No. 10/248,868, filed on Feb. 26, 2003, now Pat. No. 6,828,633.

(51) Int. Cl.
*H03K 3/01* (2006.01)

(52) U.S. Cl. ...................... 327/534; 327/427

(58) Field of Classification Search ........ 327/534–535, 327/427
See application file for complete search history.

(56) References Cited

U.S. PATENT DOCUMENTS

| | | | | |
|---|---|---|---|---|
| 6,118,328 A | * | 9/2000 | Morikawa | 327/534 |
| 6,150,869 A | * | 11/2000 | Storino et al. | 327/534 |
| 6,429,684 B1 | * | 8/2002 | Houston | 326/83 |

* cited by examiner

*Primary Examiner*—Quan Tra
(74) *Attorney, Agent, or Firm*—Jiang Chyun IP Office

(57) ABSTRACT

A silicon-on-insulator device structure having a silicon-on-insulator substrate, a transistor and a control transistor is provided. The transistor and the control transistor are disposed on the silicon-on-insulator substrate. The transistor and the control transistor share a common source region. The drain region of the transistor is electrically connected to the main body of the transistor. By forming of a control transistor between the source terminal and the main body of the transistor and switching the control transistor on or off on demand, the silicon-on-insulator device embodies the advantages of both floating-body effect and body-tied characteristic.

1 Claim, 6 Drawing Sheets

SILICON-ON-INSULATOR DEVICE STRUCTURE

CROSS-REFERENCE TO RELATED APPLICATION

This application is a divisional of a prior application Ser. No. 10/248,868, filed Feb. 26, 2003, now U.S. Pat. No. 6,828,633.

BACKGROUND OF THE INVENTION

1. Field of Invention

The present invention relates to a semiconductor device. More particularly, the present invention relates to a silicon-on-insulator (SOI) device structure.

2. Description of Related Art

Silicon-on-insulator (SOI) structure is a common substrate for building semiconductor devices. In a SOI structure, an insulation layer (mostly silicon dioxide) is formed not far away from the surface of a silicon substrate. The insulation layer isolates a silicon layer used for building semiconductor devices from the silicon substrate and hence the name silicon-on-insulator. Because the semiconductor devices is formed in a layer separated from the silicon substrate by the insulation layer, some latch-up pathways of transistors in the active area such as the ones between a source terminal and the substrate or a well region and the substrate no longer exists.

Aside from the elimination of pre-existing junction parasitic capacitance in the devices on the bulk silicon wafer and effectively limiting latch-up in semiconductor devices due to parasitic bipolar effect, semiconductor devices on a SOI structure also has a greater immunity against soft errors caused by the bombardment of alpha particles.

A device fabricated on a conventional SOI substrate has two major characteristics, the floating-body effect and body-tied characteristic. The floating-body effect increases the opening current when a device is switched on. However, the floating-body effect also increases the terminating current when the device is shut down. Ultimately, performance and reliability of the device are affected. Thus, the so-called body-tied characteristic is often employed to facilitate the electrical coupling between the source terminal of the device with the main silicon body so that the shut down current is properly controlled. Yet, the body-tied characteristic tends to limit the floating-body effect of the SOI device. Therefore, the floating-body effect and the body-tied characteristic antagonize each other and render their concurrent usage self-defeating.

SUMMARY OF THE INVENTION

Accordingly, one object of the present invention is to provide a silicon-on-insulator device structure that encompasses the advantages of floating-body effect and body-tied characteristic so that the device can have a higher opening current and a controlled current when the device is shut down. Hence, reliability of the device is improved without compromising device performance.

To achieve these and other advantages and in accordance with the purpose of the invention, as embodied and broadly described herein, the invention provides a silicon-on-insulator (SOI) device structure. The structure includes a silicon-on-insulator substrate, a first transistor and a second transistor. The first transistor and the second transistor are disposed on the silicon-on-insulator substrate such that the two transistors use a common source region. Furthermore, the drain terminal of the second transistor is electrically connected to the main body of the first transistor.

In this invention, a second transistor (a control transistor) is disposed between the source terminal of a first transistor (the silicon-on-insulator device) and a silicon main body. With this circuit configuration, the second transistor (the control transistor) can be turned on or off according to actual requirement. Hence, the advantages of both floating-body effect and body-tied characteristic can be combined to improve device reliability and maintain performance level.

This invention also provides an alternative silicon-on-insulator (SOI) device structure. The structure includes a silicon-on-insulator substrate, a first gate structure and a second gate structure, a source region, a first drain region, a second drain region, a doped region and a conductive line. The first gate structure and the second gate structure is disposed on the silicon-on-insulator substrate. The source region is formed in the silicon-on-insulator substrate between the first gate structure and the second gate structure. The first drain region is formed in the silicon-on-insulator substrate on one side of the first gate structure and the second drain region is formed in the silicon-on-insulator substrate on the other side of the second gate structure. The doped region is formed in the silicon-on-insulator to connect electrically with the silicon-on-insulator substrate underneath the first gate structure. The conductive line is formed over the silicon-on-insulator substrate to connect the doped region and the second drain region electrically.

The doping type of the doped region is identical to that of the silicon-on-insulator substrate and the doping type of the first drain region, the source region and the second drain region is opposite to the silicon-on-insulator substrate. The conductive line connects the second drain region and the doped region through a first contact and a second contact. In other words, the conductive line connects the second drain region with the silicon-on-insulator substrate underneath the first gate structure.

According to the aforementioned embodiment, a first gate structure and a second gate structure are formed over a silicon-on-insulator substrate with the second gate structure serving as a control gate. Thereafter, the source terminal of the first gate structure is connected to the second gate structure. Through the second drain region, the first contact, the conductive line, the second contact and the doped region, the first gate structure is electrically connected to the silicon-on-insulator substrate (main body) underneath the first gate structure. With this circuit configuration, the second gate structure (the control gate) can be turned on or off according to actual requirement. Hence, the silicon-on-insulator device may combine the advantages of both floating-body effect and body-tied characteristic to improve device reliability without compromising the performance level.

This invention also provides a method of operating a silicon-on-insulator device. The silicon-on-insulator device includes a transistor and a control transistor. The transistor and the control transistor share a common source terminal. The main terminal of the control transistor is electrically connected to the main body of the transistor. To turn the transistor on, a bias voltage Vcc is applied to the drain terminal of the transistor, a bias voltage Vcc is applied to the gate terminal of the transistor and 0V is applied to the gate terminal of the control transistor and the source terminal of the transistor. Thus, the main body of the transistor is electrically disconnected from the source terminal of the transistor so that the transistor has a characteristic of floating-body silicon-on-insulator device. Conversely, to turn the transistor off, a bias voltage Vcc is applied to the drain terminal of the transistor and 0V is applied to both the gate terminal and the source terminal of the transistor. In the meantime, a bias voltage Vcc is applied to the gate terminal of the control transistor so that the main body and the source terminal of the transistor are electrically connected. Hence, the transistor has a characteristic of non-floating body silicon-on-insulator device.

A control transistor is disposed between the source terminal of a silicon-on-insulator device and a silicon main body in this invention. To switch on the silicon-on-insulator device, the control transistor is shut down. Since the main body of the silicon-on-insulator device is disconnected from the source terminal electrically, the silicon-on-insulator device has a characteristic of floating-body silicon-on-insulator device. Therefore, a higher opening current is obtained. To switch off the silicon-on-insulator device, the control transistor is turned on so that the main body of the silicon-on-insulator device connects electrically with the source terminal and the silicon-on-insulator device has a characteristic of non-floating body silicon-on-insulator device. Thus, a lower shutdown current is obtained. In this invention, a control transistor is disposed between the source terminal of a silicon-on-insulator device and a silicon main body such that the control transistor is permitted to switch on or off on demand. Hence, the silicon-on-insulator device is able to embody the advantages of both the floating-body effect and body-tied characteristic and improve the reliability without compromising overall performance level.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
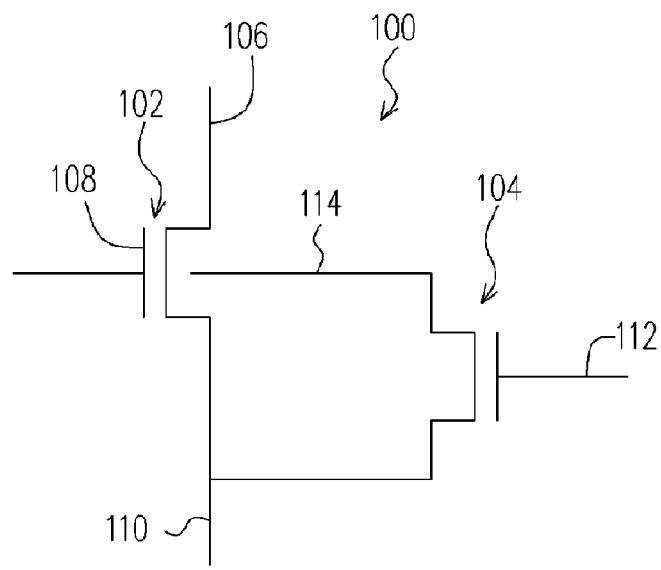
FIG. 1 is a circuit diagram of a silicon-on-insulator device according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
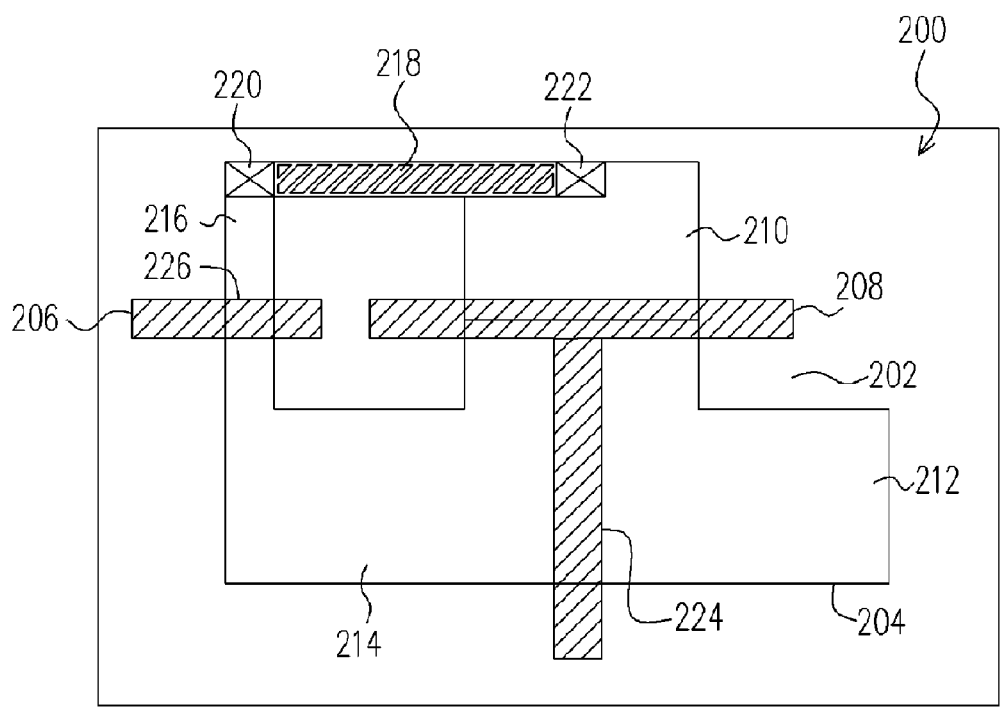
FIG. 2 is a top view of a silicon-on-insulator device according to one preferred embodiment of this invention.

FIG. 1 is a circuit diagram of a silicon-on-insulator device according to one preferred embodiment of this invention. FIG. 2 is a structural diagram of a silicon-on-insulator device according to one preferred embodiment of this invention. As shown in FIG. 1, a silicon-on-insulator device 100 includes a transistor 102 and a control transistor 104. The transistor 102 further includes a drain terminal 106, a gate terminal 108 and a source terminal 110. The control transistor 104 further includes a source terminal 110, a gate terminal 112 and a drain terminal 114. Both the transistor 102 and the control transistor 104 use a common source terminal 110. The drain terminal 114 of the control transistor 104 and the main body of the transistor 102 are electrically connected.

The silicon-on-insulator device 100 is operated according to the following schemes. To switch the transistor 102 on, a bias voltage Vcc is applied to the drain terminal 106, a bias voltage Vcc is applied to the gate terminal 108 and 0V is applied to the source terminal 110 of the transistor 102 and the sate terminal 112 of the control transistor 104. With this voltage setup, the main body of the transistor 102 and the source terminal 110 are electrically disconnected. The transistor 102 has a characteristic of floating-body silicon-on-insulator device and hence produces a higher opening current.

To switch the transistor 102 off, a bias voltage Vcc is applied to the drain terminal 106 of the transistor 102 and a 0V is applied to both the gate 108 and the source terminal 110 of the transistor 102. In the meantime, a bias voltage Vcc is applied to the gate terminal 112 of the control transistor 104. With this voltage setup, the main body of the transistor 104 is electrically connected to the source terminal 110 through the conducting control transistor 104. Hence, the transistor 102 has a characteristic of non-floating body silicon-on-insulator device capable of reducing shut down current.

FIG. 2 is a top view of a silicon-on-insulator device according to one preferred embodiment of this invention. As shown in FIG. 2, the silicon-on-insulator device 200 includes an isolation structure 202, an active region 204, a first conductive layer 206, a second conductive layer 208, a doped region 210, a first drain region 212, a source region 214, a second drain region 216, a conductive line 218, a first contact 202 and a second contact 222. The isolation structure 202 is disposed in the silicon-on-insulator substrate for isolating out the active region 204. The conductive layer 206 crosses over a portion of the active region 204 to serve as the gate structure 226 of the control transistor. The second conductive layer 208 crosses over a portion of the active region 204 to serve as the gate structure 226 of the control transistor. The doped region 210 is disposed inside the active region 204 to connect electrically with the main body of the transistor. The doping type of the doped region 210 is identical to the substrate. The drain region 212 is disposed in the active region 204 on one side of the gate structure 224. The source region 214 is disposed in the active region 204 between the first gate structure 224 and the second gate structure 226. In other words, the transistor and the control transistor share the same source terminal region 214. The drain region 212 is disposed in the active region 204 on another side of the gate structure 224. The doping type of the first drain region 212, the source region 214 and the second drain region 216 is opposite to the substrate. If the substrate is a P-type substrate, the first drain region 212, the source region 214 and the second drain region 216 are N-doped layers. On the other hand, if the substrate is an N-type substrate, the first drain region 212, the source region 214 and the second drain region 216 are P-doped layers. The conductive line 218 connects the drain region 216 and the doped region 210 of the control transistor through the first contact 220 and the second contact 222 respectively. In other words, the conductive line 218 connects the drain region 216 of the control transistor and the main body of the transistor.

FIGS. 3A to 3E are schematic top views showing the steps for producing a silicon-on-insulator device according to one preferred embodiment of this invention. FIGS. 4A to 4E are schematic cross-sectional views showing the steps for producing a silicon-on-insulator device according to one preferred embodiment of this invention. In fact, area A and area B in FIGS. 4A to 4E are respective cross-sectional views along line A–A' and B–B' of FIGS. 3A to 3E.

Figure 3A:
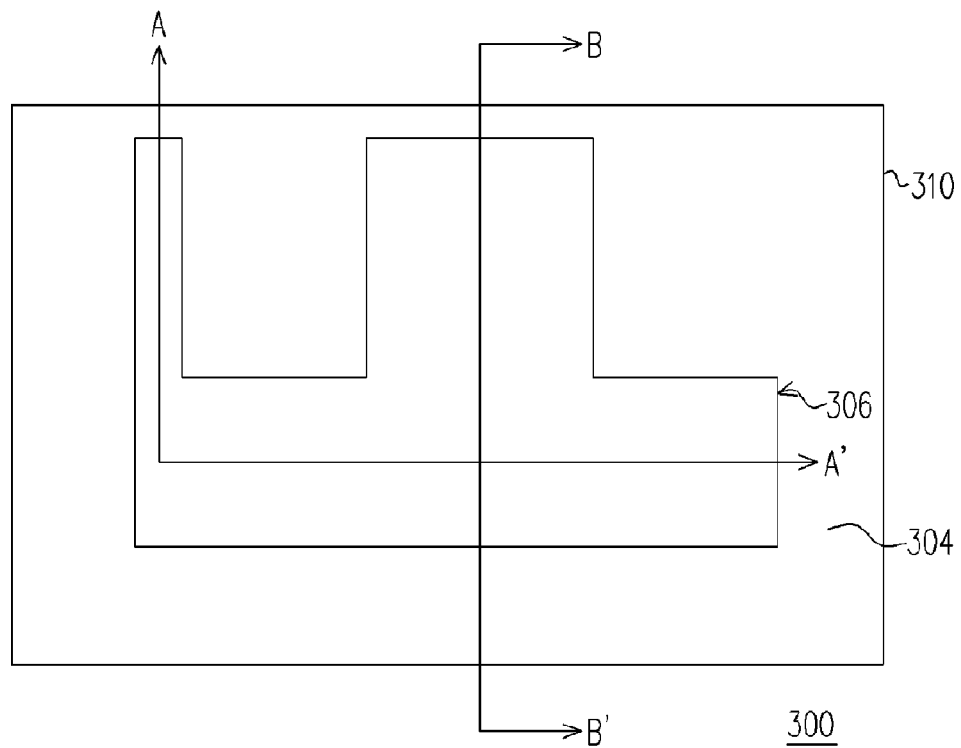
FIGS. 3A to 3E are schematic top views showing the steps for producing a silicon-on-insulator device according to one preferred embodiment of this invention.
Figure 4A:
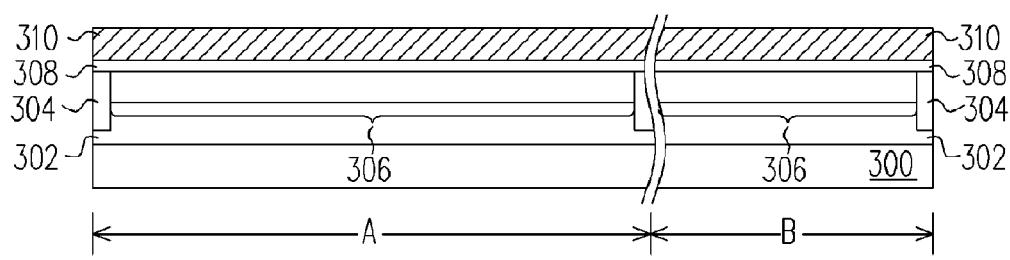
FIGS. 4A to 4E are schematic cross-sectional views showing the steps for producing a silicon-on-insulator device according to one preferred embodiment of this invention.

As shown in FIGS. 3A and 4A, a substrate 200 such as a P-type substrate is provided. A buried insulation layer 302 is formed in the substrate 300. The buried insulation layer 302 is formed, for example, using a separation by implanted oxygen (SIMOX) process or a bonded wafer process or a dielectric isolation (DI) method. The buried insulation layer 302 can be an oxide layer, for example.

An isolation structure 304 is formed over the substrate to mark out an active region 306. The isolation structure 304 is a field oxide layer such as a silicon oxide layer formed, for example, by local oxidation. Obviously, the isolation structure 304 can also be a shallow trench isolation (STI) structure, for example.

Thereafter, a gate dielectric layer 308 is formed over the substrate 300. The gate dielectric layer 308 can be a silicon oxide layer formed, for example, by thermal oxidation. A conductive layer 310 is formed over the substrate 300. The conductive layer 310 is a polysilicon layer formed, for example, by chemical vapor deposition.

Figure 3B:
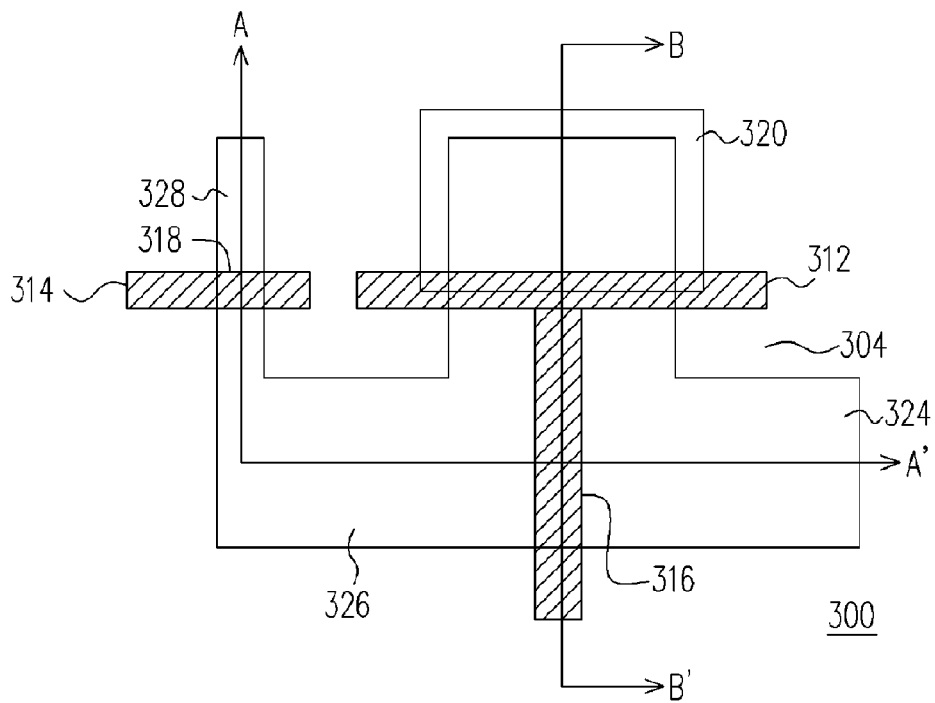
Figure 4B:
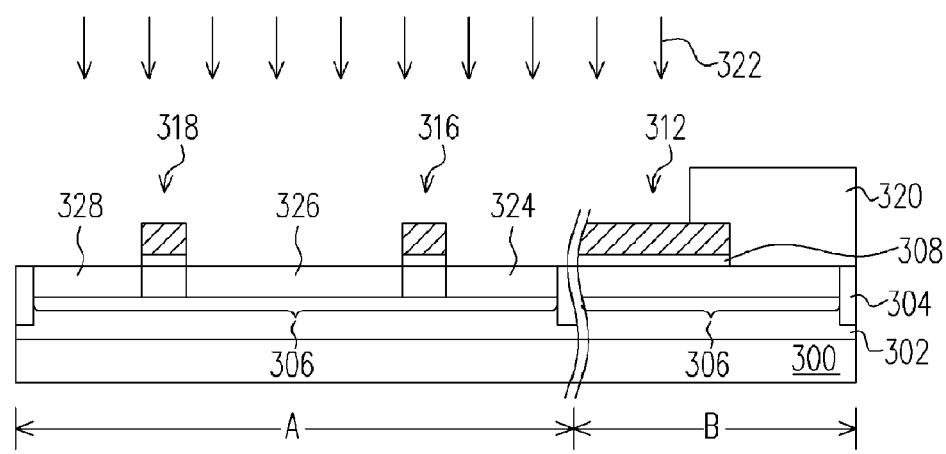

As shown in FIGS. 3B and 4B, the conductive layer 310 and the gate dielectric layer 308 are patterned using photographic and etching techniques so that the conductive layer 310 is patterned into a first conductive layer 312 and a second conductive layer 314. The first conductive layer 312 crosses over a portion of the active region 306 to serve as a gate structure for the transistor 316. Similarly, the second conductive layer 314 crosses over a portion of the active region 306 to serve as a gate structure for the control transistor 318. Thereafter, a patterned photoresist layer 320 is formed over the substrate 300. The patterned photoresist layer 320 covers the areas destined to form the doped regions. The doped region and the main body of the transistor 316 are in electrical contact. Using the patterned photoresist layer 320, the first conductive layer 312 and the second conductive layer 314 as a mask, an ion implant step 322 is carried out to form a first drain region 324, a source region 326 and a second drain region 328 in the substrate 300 on each side of the first conductive layer 312 and the second conductive layer 314. The dopants implanted into the substrate 300 in ion implant step 322 have a doping type that differs from the substrate 300 such as N-type phosphorus or arsenic ions. Both the transistor 316 and the control transistor 318 use the same source region 326.

Figure 3C:
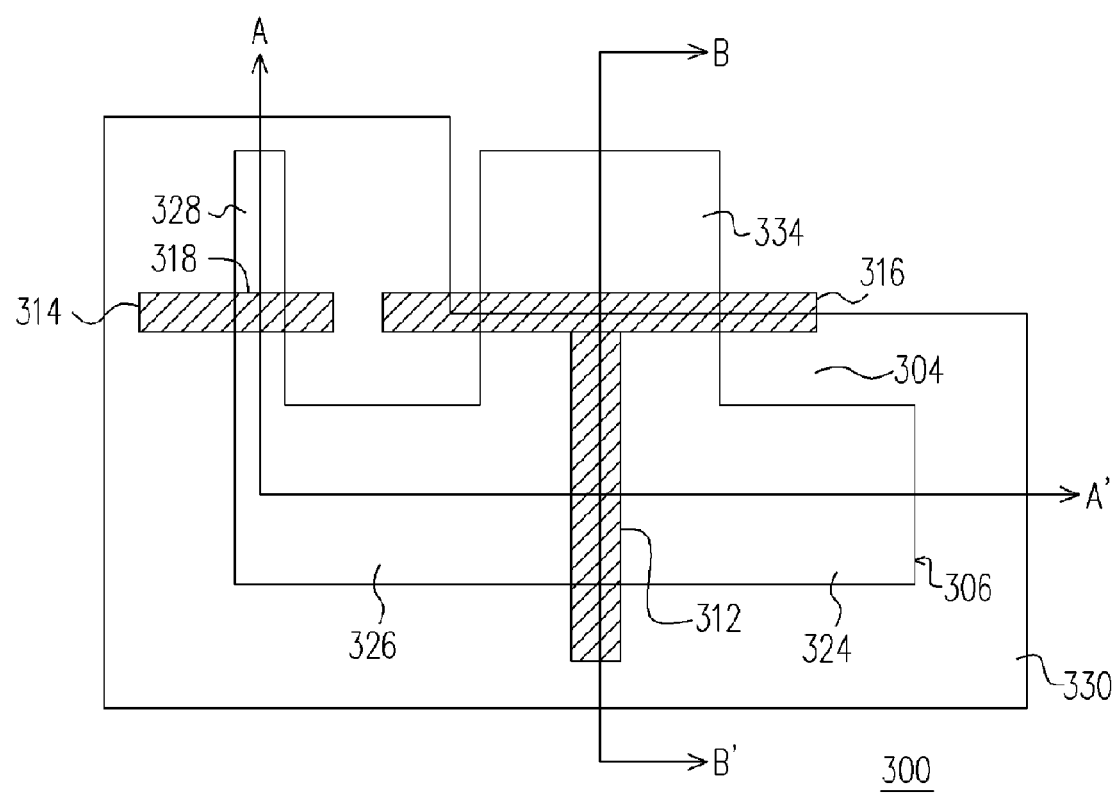
Figure 4C:
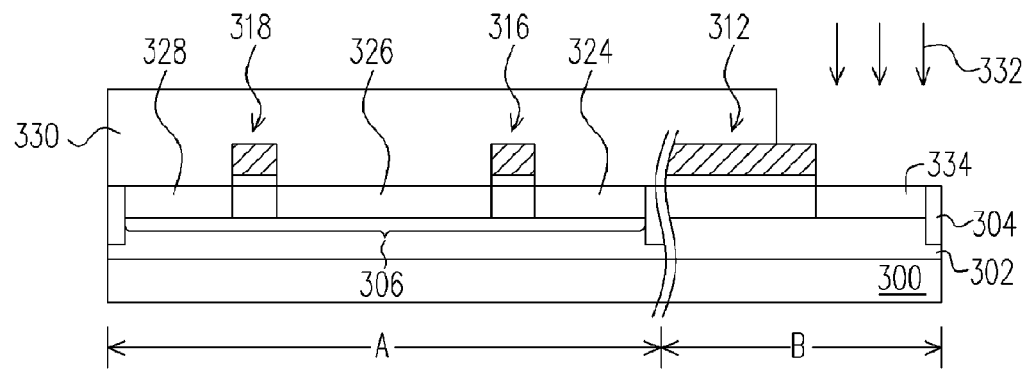

As shown in FIGS. 3C and 4C, the patterned photoresist layer 320 is removed and then another patterned photoresist layer 330 is formed over the substrate 300. The patterned photoresist layer 330 exposes the area for forming a doped region 334. Using the patterned photoresist layer 330 as a mask, an ion implant step 332 is carried out to form the doped region 334 in the substrate 300. The doped region 334 and the main body of the transistor 316 are in electrical contact. The dopants implanted into the substrate 300 in ion implant step 332 have a doping type identical to substrate 300 such as P-type boron ions.

Figure 3D:
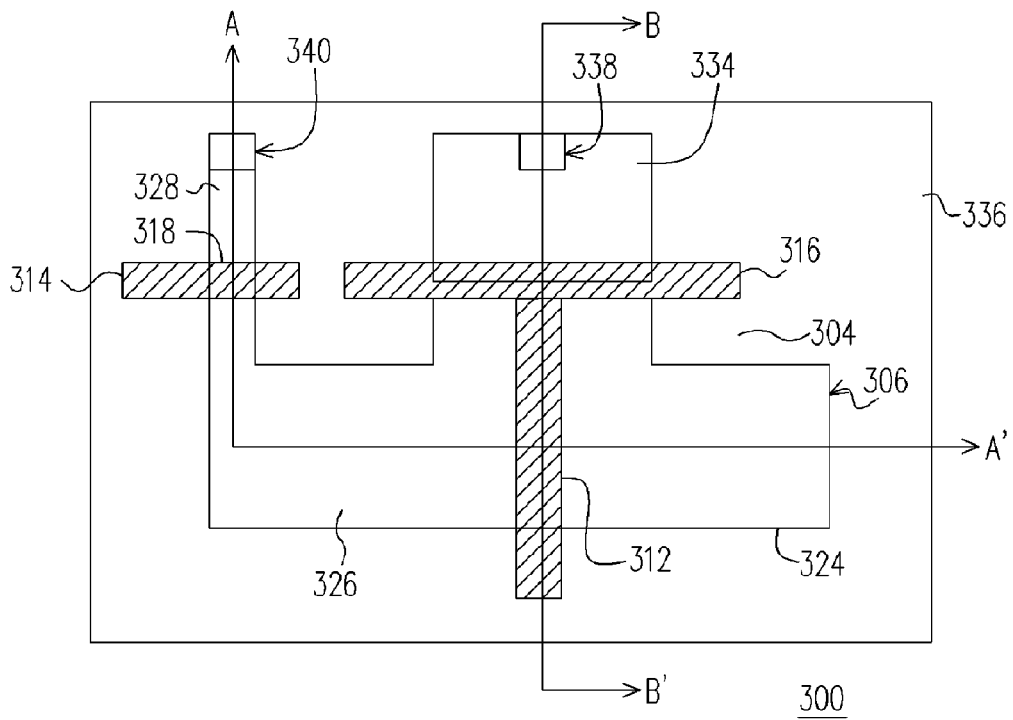
Figure 4D:
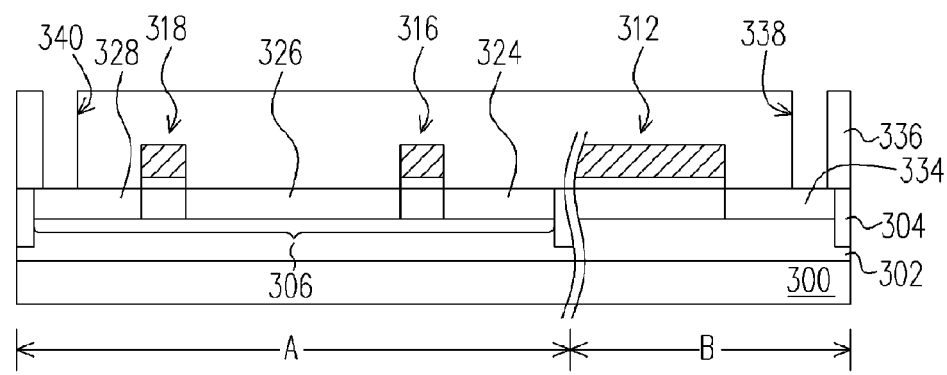

As shown in FIGS. 3D and 4D, the patterned photoresist layer 330 is removed and then an inter-layer dielectric layer 336 is formed over the substrate 300. The inter-layer dielectric layer 336 is made from borophosphosilicate glass (BPSG) or phosphosilicate glass (PSG) layer in a chemical vapor deposition, for example. Thereafter, a chemical-mechanical polishing operation is conducted to planarize the upper surface of the inter-layer dielectric layer 336. A first contact opening 338 and a second contact opening 340 are formed in the inter-layer-dielectric layer 336. The first contact opening 338 exposes a portion of the doped region 334 and the second contact opening 338 exposes a portion of the drain region 328.

Figure 3E:
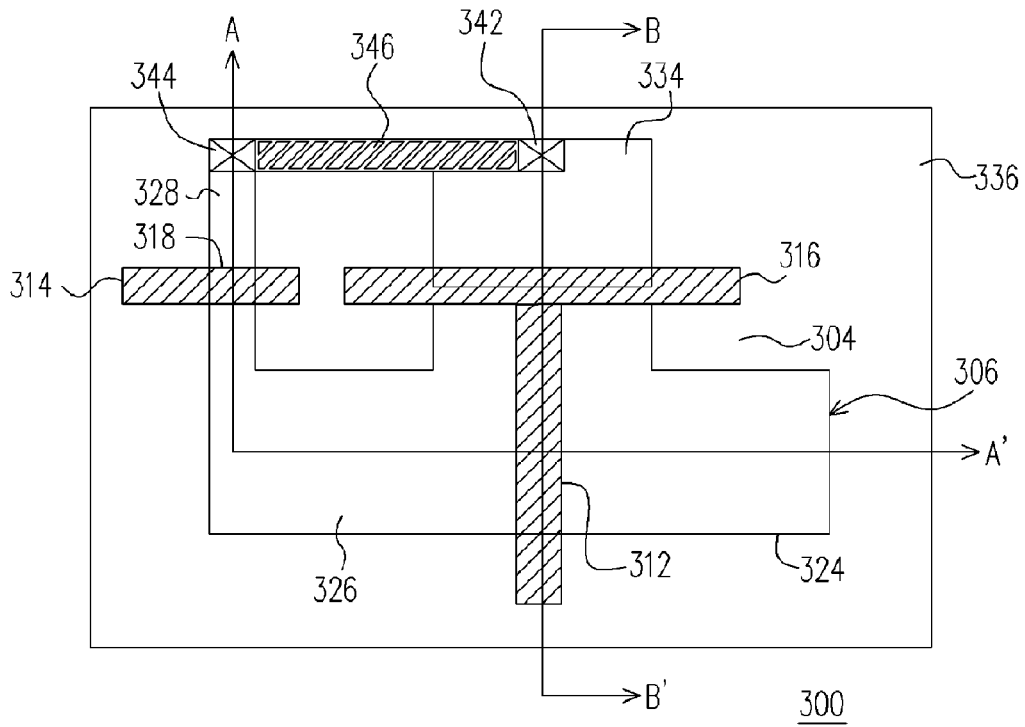
Figure 4E:
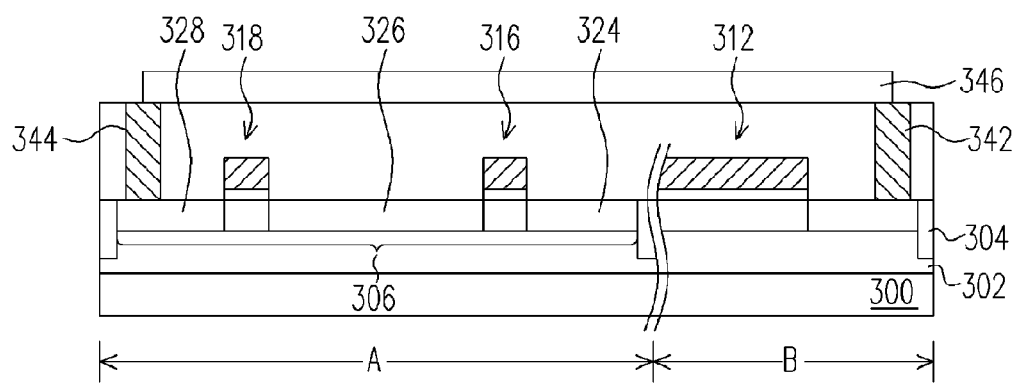

As shown in FIGS. 3E and 4E, conductive material is deposited to fill the first contact opening 338 and the second contact opening 340 so that a first contact 342 and a second contact 344 are formed inside the first opening 338 and the second opening 340 respectively. The first contact 342 and the second contact 344 are made from tungsten, for example. Thereafter, a conductive line 346 is formed over the inter-layer dielectric layer 336. The conductive layer 346 connects the first contact 342 with the second contact 344 electrically. In other words, the drain terminal 328 of the control transistor 318 is electrically connected to the main body of the transistor 316. The conductive line 346 is formed, for example, by forming a conductive layer (not shown) over the inter-layer dielectric layer 336 and then carrying out photolithographic and etching processes. Finally, conventional steps for completing the fabrication of a complete silicon-on-insulator device are carried out. Since these steps are familiar to those skilled in the art of manufacturing, detailed description is omitted here.

According to the embodiment of this invention, a control transistor is disposed between the source terminal of a silicon-on-insulator device and a silicon main body. To switch on the silicon-on-insulator device, the control transistor is shut down. Since the main body of the silicon-on-insulator device is electrically disconnected from the source terminal, the silicon-on-insulator device has a characteristic of floating-body silicon-on-insulator device. Therefore, a higher opening current is obtained. To switch off the silicon-on-insulator device, the control transistor is turned on so that the main body of the silicon-on-insulator device connects electrically with the source terminal and the silicon-on-insulator device has a characteristic of non-floating body silicon-on-insulator device. Thus, a lower shutdown current is obtained. In this invention, through the set up of a control transistor between the source terminal of a silicon-on-insulator device and a silicon main body, the control transistor can be switched on or off on demand. Hence, the silicon-on-insulator device is able to embody the advantages of both the floating-body effect and body-tied characteristic and improve the reliability without compromising overall performance level.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of operating a silicon-on-insulator device, wherein the silicon-an-insulator device includes a transistor and a control transistor such that the transistor and the control transistor share a common source region and the drain region of the control transistor is electrically connected to the main body of the transistor, the operating method comprising the following steps:

switching the transistor on by:
applying a bias voltage Vcc to the drain terminal and the gate terminal of the transistor and applying 0V to the source terminal of the transistor and the gate terminal of the control transistor, thereby terminating electrical connection between the main body of the transistor with the source terminal of the transistor so that the transistor has a characteristic of floating-body silicon-on-insulator device; and switching the transistor off by:
　applying the bias voltage Vcc to the drain terminal of the transistor and the gate terminal of the control transistor and applying 0V to the gate terminal and source terminal of the transistor, thereby forming an electrical connection between the main body of the transistor and the source terminal of the transistor so that the transistor has a characteristic of non-floating body silicon-on-insulator device.

* * * * *